US010425107B2

(12) United States Patent
Hamelin

(10) Patent No.: US 10,425,107 B2
(45) Date of Patent: Sep. 24, 2019

(54) PARTIAL SUM COMPUTATION FOR POLAR CODE DECODING

(71) Applicant: Louis-Philippe Hamelin, Montreal (CA)

(72) Inventor: Louis-Philippe Hamelin, Montreal (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 370 days.

(21) Appl. No.: 15/260,959

(22) Filed: Sep. 9, 2016

(65) Prior Publication Data

US 2018/0076831 A1 Mar. 15, 2018

(51) Int. Cl.
*H03M 13/00* (2006.01)
*H03M 13/15* (2006.01)
*H03M 13/13* (2006.01)

(52) U.S. Cl.
CPC ......... *H03M 13/157* (2013.01); *H03M 13/13* (2013.01); *H03M 13/617* (2013.01)

(58) Field of Classification Search
CPC ............ H04L 1/00; H04L 27/36; G06F 11/10; H03M 13/11; H03M 13/157; H03M 13/29; H03M 13/617; H04W 72/04
USPC ........................................................ 714/752
See application file for complete search history.

(56) References Cited

U.S. PATENT DOCUMENTS 6,324,670 B1 * 11/2001 Henriksen ........... H03M 13/091 714/799
2013/0117344 A1 * 5/2013 Gross ...................... G06F 17/10 708/490
2014/0365842 A1 12/2014 Li et al.
2015/0381208 A1 12/2015 Li et al.
2016/0241258 A1 8/2016 Zeng et al.

FOREIGN PATENT DOCUMENTS

CN 104539393 A 4/2015
CN 105811998 A 7/2016

OTHER PUBLICATIONS

Balatsoukas-Stimming, Alexios et al., "Hardware Architecture for List Successive Cancellation Decoding of Polar Codes", IEEE, arXiv:1303.7127v3 [c.IT],Feb. 27, 2014, pp. 1-6.

(Continued)

*Primary Examiner* — Albert Decady
*Assistant Examiner* — Enamul M Kabir

(57) ABSTRACT

Bits in a received word that is based on a codeword of a polar code are decoded to generate decoded bits. A lower-order partial sum is updated based on the decoded bits, and a higher-order partial sum based on the lower-order partial sum is computed. The higher-order partial sum computation is a live computation performed during decoding of a subsequent bit in the received word in some embodiments. In decoding the subsequent bit, nodes in a Data Dependency Graph (DDG) of the polar code may be traversed in a reverse order relative to node indices of at least some of the nodes in the DDG. A reverse order may also be applied to partial sum computations, to combine multiple lower-order partial sums that are based on previously decoded bits according to a reverse order relative to an order in which at least some of the previously decoded bits were decoded.

21 Claims, 10 Drawing Sheets

100

$$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

102

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

104

(56) References Cited

OTHER PUBLICATIONS

Arikan, Erdal et al.,"Channel Polarization: A Method for Constructing Capacity-Achieving Codes for Symmetric Binary-Input Memoryless Channels", IEEE Transactions on Information Theory, vol. 55, No. 7, Jul. 2009, 23 pages.

* cited by examiner $$G_2 = \begin{bmatrix} 1 & 0 \\ 1 & 1 \end{bmatrix}$$

100

$$G_2^{\otimes 2} = \begin{bmatrix} G_2 & 0 \\ G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

102

$$G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

| | | PSUM Bits (column) | | | | | | | |
|---|---|---|---|---|---|---|---|---|---|
| | | 0 | 1 | 2 | 3 | 4 | 5 | 6 | 7 |
| $\hat{u}_x$ (row) | 0 | 1 | 0 | 0 | 0 | 0 | 0 | 0 | 0 |
| | 1 | 1 | 1 | 0 | 0 | 0 | 0 | 0 | 0 |
| | 2 | 1 | 0 | 1 | 0 | 0 | 0 | 0 | 0 |
| | 3 | 1 | 1 | 1 | 1 | 0 | 0 | 0 | 0 |
| | 4 | 1 | 0 | 0 | 0 | 1 | 0 | 0 | 0 |
| | 5 | 1 | 1 | 0 | 0 | 1 | 1 | 0 | 0 |
| | 6 | 1 | 0 | 1 | 0 | 1 | 0 | 1 | 0 |
| | 7 | 1 | 1 | 1 | 1 | 1 | 1 | 1 | 1 |

FIG. 3

PARTIAL SUM COMPUTATION FOR POLAR CODE DECODING

FIELD

The present disclosure relates to generally to communications and, in particular, to computation of partial sums for decoding polar coded information.

BACKGROUND

Polar codes are proposed as channel codes for use in future wireless communications. These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation List (SCL) decoding is one option for decoding polar coded information.

It is desired to reduce the time and hardware resources required to decode received signals that are encoded using polar codes.

SUMMARY

According to an aspect of the present disclosure, a method involves receiving a word that is based on a codeword of a polar code. Bits in a decoding segment of the received word are decoded, to generate decoded bits. A lower-order partial sum is updated based on the decoded bits. A higher-order partial sum based on the lower-order partial sum is computed during decoding of a subsequent bit in the received word.

In decoding the subsequent bit, nodes in a Data Dependency Graph (DDG) of the polar code may be traversed in a reverse order relative to node indices of at least some of the nodes in the DDG.

A reverse order may also be applied to partial sum computations. For example, the partial sum computation may involve combining multiple lower-order partial sums that are based on previously decoded bits. The multiple lower-order partial sums may be combined according to a reverse order relative to an order in which at least some of the previously decoded bits were decoded.

An apparatus includes a receiver to receive a word that is based on a codeword of a polar code, and a decoder coupled to the receiver. The decoder is configured to decode bits in a decoding segment of the received word to generate decoded bits, to update a lower-order partial sum based on the decoded bits, and to compute a higher-order partial sum based on the lower-order partial sum during decoding of a subsequent bit in the received word.

According to another method, a partial sum is computed based on the decoded bits, and is used in traversing nodes in a DDG of the polar code in a reverse order relative to node indices of at least some of the nodes in the DDG, to decode subsequent bits in the received word. In an embodiment, the partial sum and at least one further partial sum that is based on previously decoded bits are combined into a higher-order partial sum according to a reverse order relative to an order in which the decoded bits and the previously decoded bits were decoded. This combining of the lower-order partial sums could be performed during decoding of the subsequent bits using the higher-order partial sum.

A decoder that is coupled to the receiver could be configured to decode bits in the received word to generate decoded bits, to compute a partial sum based on the decoded bits, and to use the lower-order partial sum in traversing nodes in a DDG of the polar code in a reverse order relative to node indices of at least some of the nodes in the DDG, to decode subsequent bits in the received word. The decoder could be further configured to combine lower-order partial sums into a higher-order partial sum according to a reverse order relative to an order in which decoded bits that were used in computing the lower-order partial sums were decoded, during decoding of subsequent bits using the higher-order partial sum.

A non-transitory processor-readable medium could be used to store instructions which, when executed by one or more processors, cause the one or more processors to perform a method as disclosed herein.

Other aspects and features of embodiments of the present disclosure will become apparent to those ordinarily skilled in the art upon review of the following description.

BRIEF DESCRIPTION OF THE DRAWINGS

Examples of embodiments of the invention will now be described in greater detail with reference to the accompanying drawings.

FIG. 1 is a diagram illustrating how larger-dimension polar coding generator matrices can be produced from smaller-dimension generator matrices.

FIG. 3 is a table illustrating an 8-by-8 polar code matrix and contributions of previously decoded bits $\hat{u}_x$ to partial sum (PSUM) bits.

DETAILED DESCRIPTION

FIG. 1 is a diagram showing how larger-dimension polar coding generator matrices can be produced from smaller-dimension generator matrices. In this example, the 2-fold Kronecker product matrix $G_2^{\otimes 2}$ 102 and the 3-fold Kronecker product matrix $G_2^{\otimes 3}$ 104 are examples of polar coding generator matrices produced from the 2-by-2 matrix $G_2$ 100. The generator matrix approach illustrated in FIG. 1 can be expanded to produce an m-fold Kronecker product matrix $G_2^{\otimes m}$. A polar code can be formed from a Kronecker product matrix based on matrix $G_2$ 102. For a polar code having codewords of length $N=2^m$, the generator matrix is $G_2^{\otimes m}$.

A polar SCL decoder decodes N-bit codewords using a successive cancellation polar code algorithm with L decoding paths, where L is the list size of the polar SCL decoder. This type of decoding is based on successive cancellation with an N-by-N polar code. To estimate a decoded bit value $\hat{u}_x$, a tree of M stages ($M=\log_2(N)$) composed of F and G nodes combines pairs of channel Log Likelihood Ratio (LLR) values with a partial sum of previously decoded bits. An LLR value is a 6-bit signed binary number in an embodiment. The quantization, or bit length, of LLR values could be different in other embodiments. LLR bit length could be selected based on a target block error performance, for example. Although decoding computation accuracy increases with the number of bits in the LLR values, the size of a decoder also increases with the number of bits in the LLR values.

Figure 2:
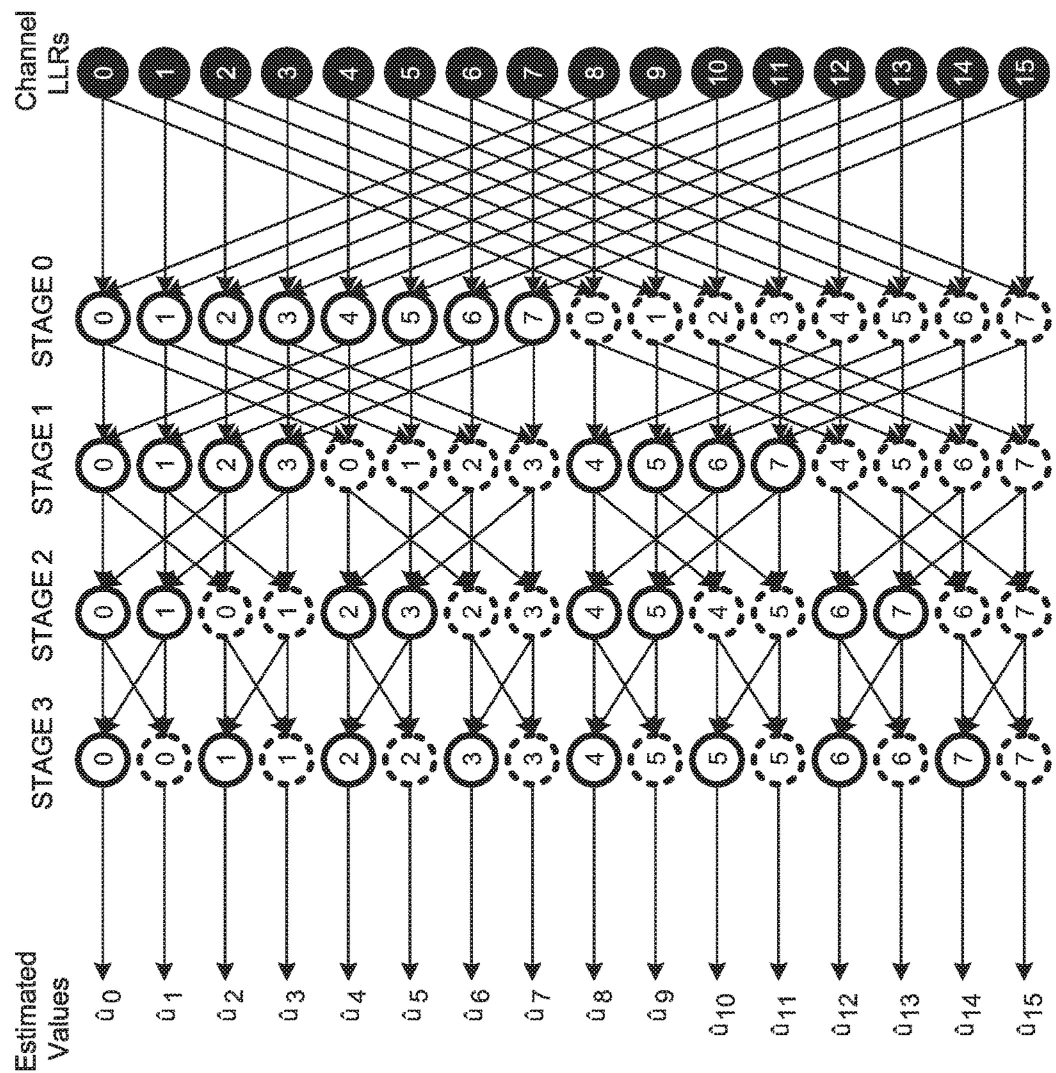
FIG. 2 is a block diagram of F/G function nodes in a Data Dependency Graph (DDG) for an example polar decoder.

FIG. 2 is a block diagram of F and G function nodes in a Data Dependency Graph (DDG) for a polar decoder, and also illustrates the LLR tree for a codeword length of 16 bits. In this example, the decoder has four stages with 8 nodes per stage. Each node implements an F function and a G function, in circuitry such as a Processing Element (PE) that is configurable to execute the F function or the G function. Each node is visited twice at each stage to decode a codeword, first to execute the F function and then to execute the G function. F functions of the nodes, which are shown as solid line circles in FIG. 2 and are also referred to herein as F nodes, combine only LLR values. G functions of the nodes, which are shown as dashed line circles in FIG. 2 and are also referred to herein as G nodes, use partial sums in addition to LLR values. Channel LLR values, which represent bits that are received over a communication medium, are shown at the right-hand side of FIG. 2, and the estimated values $\hat{u}_0$ to $\hat{u}_{15}$ are decoded bits.

Partial sum bits that are used by the G nodes are not shown in FIG. 2. As an example, for a 16-bit codeword length, the G nodes use the following partial sum bits:

LLR Stage #0 G nodes #0-7 use PSUM bits $\hat{u}_0+\hat{u}_1+\hat{u}_2+\hat{u}_3+\hat{u}_4+\hat{u}_5+\hat{u}_6+\hat{u}_7$, $\hat{u}_0+\hat{u}_2+\hat{u}_4+\hat{u}_6$, $\hat{u}_2+\hat{u}_3+\hat{u}_6+\hat{u}_7$, $\hat{u}_3+\hat{u}_7$, $\hat{u}_4+\hat{u}_5+\hat{u}_6+\hat{u}_7$, $\hat{u}_5+\hat{u}_7$, $\hat{u}_6+\hat{u}_7$ and $\hat{u}_7$ LLR Stage #1 G nodes #0-3 use PSUM bits $\hat{u}_0+\hat{u}_1+\hat{u}_2+\hat{u}_3$, $\hat{u}_1+\hat{u}_3$, $\hat{u}_2+\hat{u}_3$ and $\hat{u}_3$ LLR Stage #1 G nodes #4-7 use PSUM bits $\hat{u}_8+\hat{u}_9+\hat{u}_{10}+\hat{u}_{11}$, $\hat{u}_9+\hat{u}_{11}$, $\hat{u}_{10}+\hat{u}_{11}$ and $\hat{u}_{11}$ LLR Stage #2 G nodes #0-1 use PSUM bits $\hat{u}_0+\hat{u}_1$ and $\hat{u}_1$ LLR Stage #2 G nodes #2-3 use PSUM bits $\hat{u}_4+\hat{u}_5$ and $\hat{u}_5$ LLR Stage #2 G nodes #4-5 use PSUM bits $\hat{u}_8+\hat{u}_9$ and $\hat{u}_9$ LLR Stage #2 G nodes #6-7 use PSUM bits $\hat{u}_{12}+\hat{u}_{13}$ and $\hat{u}_{13}$ LLR Stage #3 G node #0 uses PSUM bit $\hat{u}_0$ LLR Stage #3 G node #1 uses PSUM bit $\hat{u}_2$ LLR Stage #3 G node #2 uses PSUM bit $\hat{u}_4$ LLR Stage #3 G node #3 uses PSUM bit $\hat{u}_6$ LLR Stage #3 G node #4 uses PSUM bit $\hat{u}_8$ LLR Stage #3 G node #5 uses PSUM bit $\hat{u}_{10}$ LLR Stage #3 G node #6 uses PSUM bit $\hat{u}_{12}$ LLR Stage #3 G node #7 uses PSUM bit $\hat{u}_{14}$.

At each stage in FIG. 2, there are 8 G nodes, and each G node uses one PSUM bit in executing the G function.

The decoder traverses the LLR tree from right (Stage #0) to left (Stage #3), top to bottom. To estimate the value $\hat{u}_0$ of the decoded bit #0:

1. Stage #0 F nodes #0-7 combine 16 channel LLR values in up to 8 parallel PE units 2. Stage #1 F nodes #0-3 combine Stage #0 LLR results in up to 4 parallel PE units 3. Stage #2 F nodes #0-1 combine Stage #1 LLR results in up to 2 parallel PE units 4. Stage #3 F node #0 combines Stage #2 LLR results in 1 PE unit.

The decoder uses the Stage #3 (last) LLR results to estimate each decoded bit #x value $\hat{u}_x$. If the LLR value>=0, then the estimated value of decoded bit #x is $\hat{u}_x=0$, and if the LLR value<0, then the estimated value of decoded bit #x is $\hat{u}_x=1$.

The decoder may store the intermediate Stage #0-Stage #2 LLR values, so that estimation of the next decoded bits need not start over at Stage #0. For example, with the intermediate Stage #0-Stage #2 LLR values from the bit #0 decoding available from LLR memory, to estimate the value $\hat{u}_1$ of the decoded bit #1:

5. Stage #3 G node #0 combines Stage #2 LLR results with partial sum bit $\hat{u}_0$.

To estimate the value $\hat{u}_2$ of the decoded bit #2:

6. Stage #2 G nodes #0-1 combine Stage #1 LLR results with partial sum bits $\hat{u}_0+\hat{u}_1$ and $\hat{u}_1$ 7. Stage #3 F node #1 combines Stage #2 LLR results.

To estimate the value $\hat{u}_3$ of the decoded bit #3:

8. Stage #3 G node #1 combines Stage #2 LLR results with partial sum bit $\hat{u}_2$.

To estimate the value $\hat{u}_4$ of the decoded bit #4:

9. Stage #1 G nodes #0-3 combine Stage #0 LLR results with partial sum bits $\hat{u}_0+\hat{u}_1+\hat{u}_2+\hat{u}_3$, $\hat{u}_1+\hat{u}_3$, $\hat{u}_2+\hat{u}_3$ and $\hat{u}_3$ 10. Stage #2 F nodes #2-3 combine Stage #1 LLR results 11. Stage #3 F node #2 combines Stage #2 LLR results.

The decoder repeats this recursive process until it reaches the last codeword bit $\hat{u}_{N-1}$.

A Successive Cancellation (SC) decoder tracks one decoding path. After the value of a decoded bit is estimated, the other possible value is ignored. Decoding continues with the next bit, assuming that the previous bits have been correctly estimated when updating partial sum results.

For example, for a codeword length of N=8, there are $2^8=256$ possibilities for the estimated values $\hat{u}_0$ to $\hat{u}_7$. As codeword length increases, the number of possibilities grows exponentially, and evaluation of all combinations of $\hat{u}_x$ becomes impractical. By tracking multiple decoding paths according to a list of size L, SCL decoders may offer better decoding performance than SC decoders, with reasonable size and complexity. An SCL decoder monitors the best L decoding paths simultaneously.

Each decoding path from the root (decoded bit #0) of a decoding tree is associated with a Path Metric (PM). A decoding path appends each newly decoded bit to previous estimated values. After the LLR computations for each decoded bit, path metrics are continuously updated using the LLR values as follows:

if the LLR value>=0

PM[0, i+1]=PM[i]

PM[1, i+1]=PM[i]+|LLR| if the LLR value<0

PM[0, i+1]=PM[i]+|LLR|

PM[1, i+1]=PM[i].

The best decoding paths have the smallest PM values. If an LLR is less than 0, then decoded bit is most likely a 1, so the next PM for the estimated value 1 (PM[1, i+1]) remains the same as the current path metric, and the absolute LLR value is added to the PM for the estimated value 0 (PM[0, i+1]), in effect "penalizing" the less likely path with the absolute LLR value. If the LLR value is near 0, then the decision for the value of $\hat{u}_x$ is unreliable and the PM penalty on the penalized path is small.

For every decoded bit in a decoding tree, each decoding path produces 2 new decoding paths. After the number of decoding paths reaches L, an SCL decoder selects, from the 2L PMs for the 2L candidate decoding paths, the L paths with the lowest PMs, and drops the other L decoding paths. In Cyclic Redundancy Check (CRC)-aided list decoding, a CRC is run against the L selected decoding paths after the last codeword bit $\hat{u}_{N-1}$ is estimated. The decoding path with a successful CRC and the best PM is selected as the decoded codeword. If all of the decoding paths fail the CRC, then the decoding path with the best PM may be selected.

The partial sum bits for the G nodes are computed and updated using the estimated values $\hat{u}_x$ of previously decoded bits. A partial sum bit is a free-running sum (modulo 1) of some $\hat{u}_x$ based on the polar code matrix. Partial sum bits are individually computed for all L decoding paths. The partial sum bit that is used by a G node depends on the LLR stage and the node index or ID as shown in FIG. 2. The decoded bit index or position in a received word is used to determine from which LLR stage decoding of that bit begins, as in the above example of decoding bits #0 to #4.

FIG. 3 is a table illustrating an 8-by-8 polar code matrix of the contributions of previously decoded bits $\hat{u}_x$ to partial sum bits. The polar code matrix in FIG. 3 corresponds to the partial sum bit structure for the 8 ($2^3$) most recently estimated values $\hat{u}_x$. The basic 2-by-2 polar code matrix is shown at the top left of FIG. 3. Partial sum bits are updated according the polar code matrix, by modulo 1 adding $\hat{u}_x$ (equivalent to an XOR operation) to each partial sum bit for which the polar code matrix includes a 1 in the row corresponding to $\hat{u}_x$. For example, with reference to FIG. 3, the only cell in the row corresponding to $\hat{u}_0$ is the cell in the column for PSUM bit #0, and therefore PSUM bit #0 is updated with $\hat{u}_0$ after $\hat{u}_0$ has been decoded. Similarly, PSUM bits #0 and #1 are updated with $\hat{u}_1$ after $\hat{u}_1$ has been decoded, and so on. The partial sum bit values, after decoding of a subset of 8 received bits to generate 8 decoded bit estimated values ($\hat{u}_x$), are as follows in an example:

PSUM bit #0=$\hat{u}_0+\hat{u}_1+\hat{u}_2+\hat{u}_3+\hat{u}_4+\hat{u}_5+\hat{u}_6+\hat{u}_7$
PSUM bit #1=$\hat{u}_1+\hat{u}_3+\hat{u}_5+\hat{u}_7$
PSUM bit #2=$\hat{u}_2+\hat{u}_3+\hat{u}_6+\hat{u}_7$
PSUM bit #3=$\hat{u}_3+\hat{u}_7$
PSUM bit #4=$\hat{u}_4+\hat{u}_5+\hat{u}_6+\hat{u}_7$
PSUM bit #5=$\hat{u}_5+\hat{u}_7$
PSUM bit #6=$\hat{u}_6+\hat{u}_7$
PSUM bit #7=$\hat{u}_7$.

Partial sums are denoted herein as PSm(y:z), where m is the size of the partial sum (and the polar code matrix that defines how the partial sum bits are computed) and y:z is the partial sum bit range. The size of the polar code matrix, which is equivalent to the number of partial sum bits, is dependent upon the LLR stage. For example, for N=16, Stage #0 G nodes #0-7 receive partial sum bits from a PS8 partial sum, Stage #1 G nodes #0-3 and #4-7 receive partial sum bits from PS4 partial sums, Stage #2 G nodes #0-1, #2-3, #4-5, and #6-7 receive partial sum bits from PS2 partial sums, and Stage #3 G nodes #0, #1, #2, #3, #4, #5, #6, and #7 receive partial sum bits from PS1 partial sums. The PSUM size relationship is fixed to the DDG LLR stage. The LLR stage and decoded bit index or position in a received word determine the partial sum bit range.

For example, for an N=2048-bit codeword and a decoder with 11 Stages #0 to #10, partial sum bit details for decoded bit 169 are as follows in an embodiment:

LLR Stage #3 G nodes #0-127=PS128(0-127)
LLR Stage #5 G nodes #64-91=PS32(128-159)
LLR Stage #7 G nodes #80-87=PS8(160-167)
LLR Stage #10 G node #84=PS1(168).

FIG. 3 illustrates an 8-by-8 polar code matrix. To build a 16-by-16 polar code matrix, the 8-by-8 polar code matrix is replicated in the upper left, lower left and lower right quadrants of a new matrix and the upper right quadrant is filled with zeros, as shown at 104 in FIG. 1. This procedure can be repeated recursively to obtain the polar code matrices of size 32-by-32, 64-by-64, . . . , N-by-N. The polar code matrices also define partial sum computations based on previous decoded bits. This is shown in FIG. 4, which is a block diagram illustrating relationships between different sizes or orders of polar code matrices which define partial sum computations for decoding polar coded information.

The partial sum computation or update sequence is repetitive. The first half (upper rows) of estimated values $\hat{u}_{y:z}$ contribute to half of the first PSUM bits (left columns). This is because the upper right quadrant of a polar code matrix includes all zeros and partial sum bits are updated based on decoded bits according to the polar code matrix, as noted above. The second half (lower rows) of the estimated values $\hat{u}_{y:z}$ contribute to all PSUM bits (all columns). This polar coding matrix sequence and partial sum computation sequence are repeated for any polar code matrix size, as shown in FIG. 4.

Figure 4:
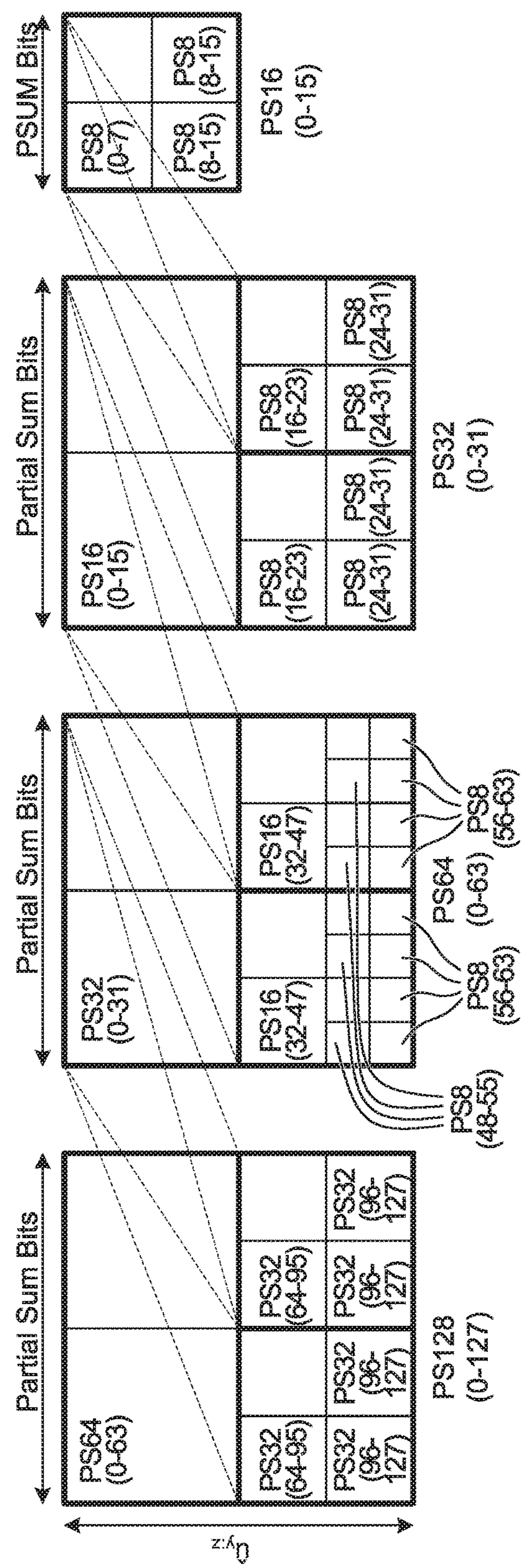
FIG. 4 is a block diagram illustrating relationships between different orders of polar code matrices which define partial sum computations for decoding polar coded information.

In FIG. 4, polar coding matrices are designated PSm(y-z) where m is the size of the polar code matrix (and the partial sum that is computed based on the polar code matrix) and y-z is a column range. Each column corresponds to a partial sum bit, as shown in FIG. 3 and described above. For example, for PS16(0-15) at the right-hand side of FIG. 4:

PS16(0-7)=PS8(0-7)+PS8(8-15)
PS16(8-15)=PS8(8-15), and for PS32(0-31):

PS32(0-15)=PS16(0-15)+PS8(16-31)
PS32(16-31)=PS16(16-31).

This pattern can be used to generate other sizes or orders of polar coding matrices, and to compute other sizes or orders of partial sums as well, and PS64(0-63) and PS128 (0-127) polar code matrices which define computations of higher-order partial sums are shown in FIG. 4 as examples.

According to conventional SCL decoding, a main decoding loop for each codeword bit x involves:

- for each of up to L decoding paths, traversing the DDG by combining pairs of LLR values and available partial sum bits at the DDG nodes, and estimating $\hat{u}_x$ using the final stage LLR result
- sorting the up to 2L PMs (each 'parent' decoding path generates 2 child PMs) and selecting the best L decoding paths, if the number of decoding paths is greater than L
- for each selected surviving path, updating the partial sums with its $\hat{u}_x$ value; in FIG. 3, for example, when bit #7 is decoded, all 8 PSUM bits need to be updated
- moving to the next codeword bit and restarting the main loop.

Decoding exits the main decoding loop when the Nth codeword bit is reached. The decoding path with the best PM, and optionally with a valid CRC in CRC-aided list decoding, is set as the decoded codeword.

All of the decoding paths are independent. However, for better performance, the DDG traversal in the first step of the conventional SCL main decoding loop may be executed for all decoding paths simultaneously. At the third step of the conventional SCL main decoding loop, partial sum updating may similarly be performed simultaneously to update partial sums for all decoding paths. After the number of decoding paths exceeds L, decoding of a next codeword bit i+1 cannot start until the PM sort is completed, the surviving decoding paths are selected, and all partial sums are updated. In some implementations, for better throughput and reduced latency, an SCL decoder decodes 2 or more bits in parallel. For example, when 2 bits are decoded, a last stage F (even index) node and G (odd index) node can be run in parallel, 4 child paths are generated. The best L paths are selected from the resultant 4L paths during path sorting, and all partial sums are updated.

A partial sum is a linear combination of previously decoded bits. A decoder stores N partial sum bits for each decoding path. The number of partial sum bits to be updated increases as the decoded bit index increases, to a worst case after bit index ((N/2)−1). In an example of N=2048, after decoding bit i=1023, 1024 partial sum bits require an update. For a list size L=32, the decoder must update 32 kb of partial sum bits for the decoding of codeword bit i=1024.

Partial sum bits are typically stored in memory because of the storage size required to accommodate the number of values to be stored. The number of cycles required to update the partial sum bits depends on memory width. For a 256-bit wide memory, for example, a conventional decoder spends 128 cycles updating 32 kb of partial sum bits after codeword bit i=1023, in an implementation with N=2048 and L=32. As shown in the table below, partial sum updates add 1024 cycles to codeword decoding latency in this example. This is a theoretical number, and does not account for decoder overhead and memory access latency.

partial sum storage during computation of partial sum bits in higher-order partial sums, for example. Higher-order partial sums may also be computed in a reverse direction, relative to an order in which previously decoded bits were decoded, as described in further detail below.

Partial sum computation during decoding of subsequent bits of a received word, is also referred to herein as "live" partial sum computation. In an embodiment, live partial sum computation uses 3 storage structures, including:

in-flight partial sum storage in flip-flops or registers to compute partial sum bits based on a decoding segment or sub-block of previous decoded bits $\hat{u}_x$, illustratively 8 previous decoded bits partial sum memory to preserve partial sum bits for use in decoding subsequent bits in a received word a partial sum scratchpad to temporarily store partial sum bits of lower-order partial sums for live computation of higher-order partial sums.

These storage structures need not necessarily be implemented in distinct physical memory devices. For example, the in-flight partial sum storage could be implemented in flip-flops or registers as noted above, and the partial sum memory and the partial sum scratchpad could be implemented in one or more other memory devices. In an embodiment, the partial sum memory and the partial sum scratchpad are implemented using a dual-port memory device, with one port accessing the partial sum memory and the other port accessing the partial sum scratchpad. The in-flight partial sum storage, the partial sum memory, and the partial sum scratchpad could therefore be considered different logical sources of partial sums, but need not be implemented in different physical memory devices.

| | Stage | | | | | | | | | | |
|---|---|---|---|---|---|---|---|---|---|---|---|
| | 0 | 1 | 2 | 3 | 4 | 5 | 6 | 7 | 8 | 9 | 10 |
| # of PSUM bits | 1024 | 512 | 256 | 128 | 64 | 32 | 16 | 8 | 4 | 2 | 1 |
| # of visit (G node) | 1 | 2 | 4 | 8 | 16 | 32 | 64 | 128 | 256 | 512 | 1024 |
| # of cycles to update PSUM | 128 | 64 | 32 | 16 | 8 | 4 | 2 | 1 | | | |
| Total # of cycles | 128 | 128 | 128 | 128 | 128 | 128 | 128 | 128 | Total | 1024 | cycles |

Optimal codeword decoding latency is approximately 17920 cycles, with parallel execution of 32 paths with 8 PEs per path, 5-cycle path metric sort per decoded bit, PSUM update and 1024-cycle CRC overhead. In this example, the partial sum updates consume 5.7% of total latency.

According to an embodiment disclosed herein, partial sum bits in higher-order partial sums are computed (updated) during decoding of subsequent bits in a received word. Instead of dedicating cycles to updating all partial sum bits before starting decoding of a next bit, a decoder performs a partial sum computation during decoding of subsequent bits, and the results of the partial sum computations are used by G nodes to calculate LLR results. For example, partial sum bits could be updated based on decoded bit $\hat{u}_x$ during LLR computations for decoding subsequent bits.

As noted above, DDG nodes are normally traversed during decoding in a direction from right to left and top to bottom in FIG. 2, for example. Executing the G function for those G nodes starting at the bottom nodes is therefore according to a reverse node order relative to an order of the node indices, in which at least some of the nodes are normally traversed during decoding. Such a backward DDG direction may allow zero additional latency for partial sum updating, and may also reduce or minimize temporary With live partial sum construction, a decoder main decoding loop for each bit #x may be rewritten as follows:

for each decoding path, traverse the DDG by combining pairs of LLR values and newly computed partial sum bits, and estimate $\hat{u}_x$ using the final stage LLR result sort up to 2L PMs and select the best L decoding paths, if the number of decoding paths is greater than L move to the next bit and restart the main loop.

Figure 5:
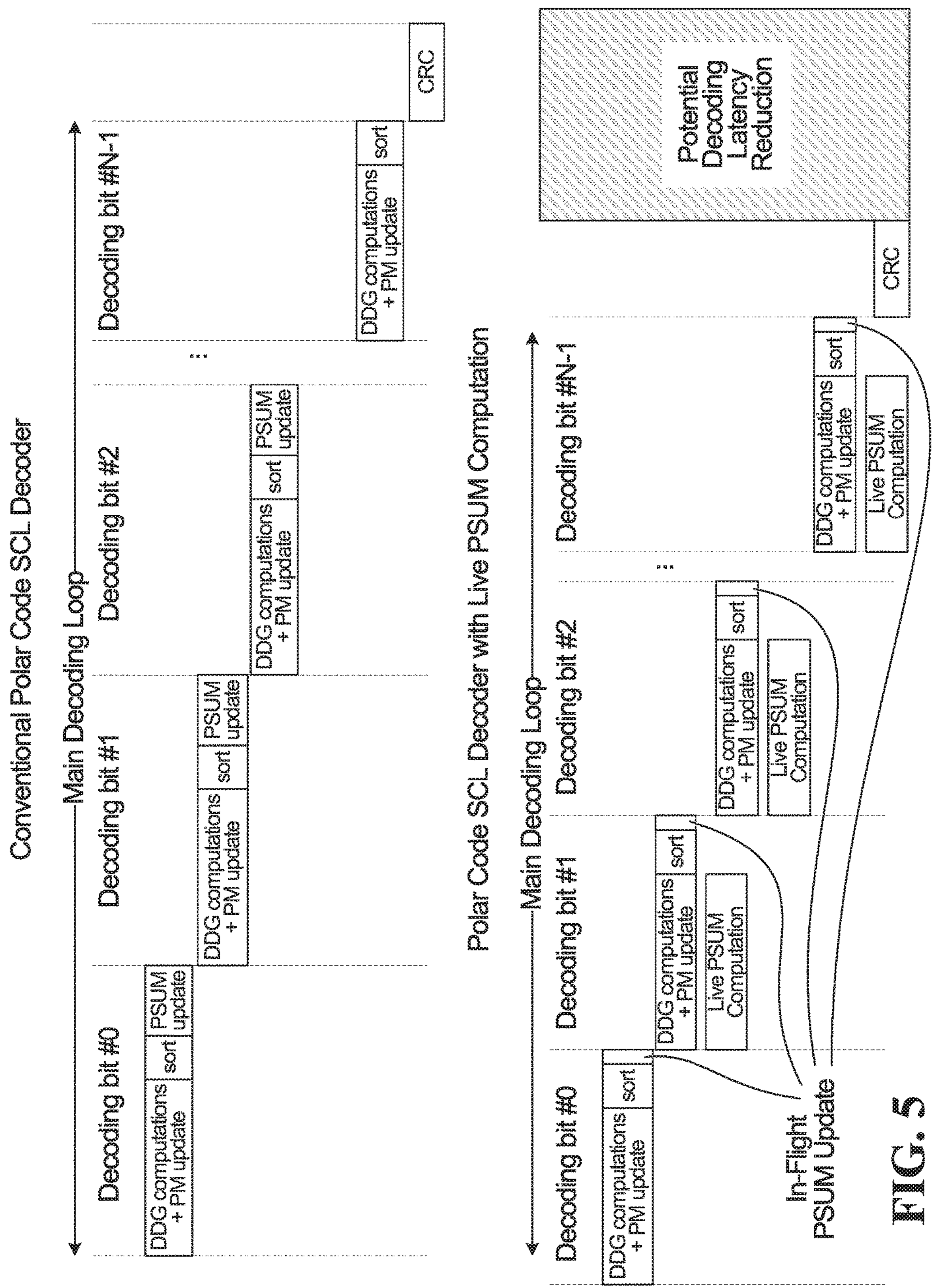
FIG. 5 is a timing diagram illustrating a main decoding loop of a conventional polar code SCL decoder and an example main decoding loop polar code SCL decoder with partial sum computation in accordance with an embodiment.

Live partial sum computation may reduce decoding latency by performing partial sum computations for at least higher-order partial sums during decoding of subsequent bits in a received word. FIG. 5 is a timing diagram illustrating a main decoding loop of a conventional polar code SCL decoder and an example main decoding loop polar code SCL decoder with live partial sum computation in accordance with an embodiment. In the conventional polar code SCL decoder, partial sum updates are performed when one bit has been decoded but before decoding of the next bit is started. According to embodiments disclosed herein, partial sum computations for higher-order partial sum structures, other than in-flight partial sum updates, are performed during decoding of subsequent bits.

The "PSUM update" in the main decoding loop for the conventional polar code SCL decoder is a full PSUM update of all PSUM bits to which a current decoded bit contributes. With live PSUM computation, although there may be PSUM updates to PSUM bits in a lower-order PSUM, PSUM computations to update PSUM bits in higher-order PSUMs are performed during decoding of subsequent bits. The lower-order PSUM updates are shown as "In-Flight PSUM Update" in the main decoding loop for a polar code SCL decoder with live PSUM computation in FIG. 5, and the higher-order computations are shown as "Live PSUM Computation. The potential decoding latency reduction shown in FIG. 5 is intended to illustrate an accumulation of all of the "PSUM update" operations in the conventional polar code SCL decoder main decoding loop, less the "In-Flight PSUM Update" operations in the main decoding loop for the polar code SCL decoder with live PSUM computation.

Figure 6:
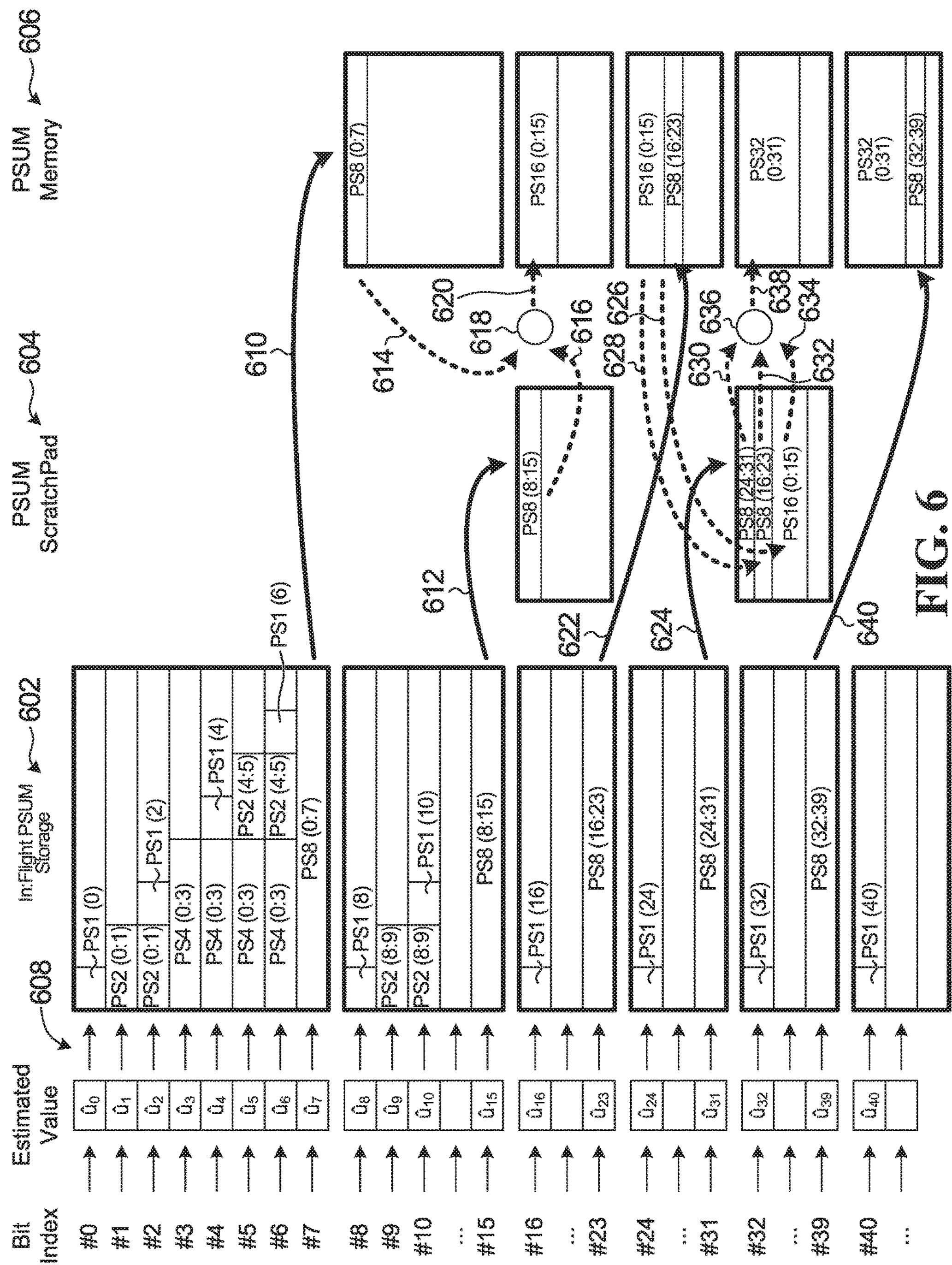
FIG. 6 is a diagram illustrating partial sum computation according to an embodiment.

FIG. 6 is a diagram illustrating partial sum computation according to an embodiment. The above-referenced in-flight PSUM storage, PSUM scratchpad, and PSUM memory, and their contents after decoding bits in a received word, are shown at 602, 604, 606, respectively. Although the in-flight PSUM storage 602, the PSUM scratchpad 604, and the PSUM memory 606 are shown separately in FIG. 6, these elements need not necessarily be implemented in separate memory devices. The arrows in FIG. 6 illustrate storage or memory access operations, and the circles represent computation of higher-order partial sums from lower-order partial sums.

After each bit in a received word is decoded to generate an estimated value $\hat{u}_x$, a partial sum PSm(y:z) is updated in the in-flight PSUM storage 602. This type of partial sum update is represented in FIG. 6 by the arrows 608. For example, PS1(0) is updated based on decoded bit #0, with estimated value $\hat{u}_0$, PS2(0:1) is updated after decoding of bit #1, based on decoded bit #1 with estimated value $\hat{u}_2$ and the previous partial sum PS1(0), and so on. In a conventional polar SCL decoder, this PSUM updating uses PSUM memory, and the PSUM reaches a maximum size of PS[N/2]. The in-flight PSUM storage 602, however, stores only lower-order PSUMs PS1, PS2, PS4, and PS8 for each segment of 8 bits in the example shown, and only those PSUMs are updated after each bit is decoded.

An 8-bit decoding segment is used herein as an illustrative example. Other decoding segment sizes may be used in other embodiments. Similarly, 8 PEs are used in implementing each decoding path in a decoder in an embodiment, but other embodiments could include different numbers of PEs. Although decoding segment length in bits may match the number of PEs, the number of bits per decoding segment may be different from the number of PEs per decoding path.

The PS8(0:7) partial sum shown in the in-flight PSUM storage 602 is written to the PSUM memory 606 when decoding of the 8-bit segment in this example is complete. This writing to memory, as shown at 610, is during decoding of bit #8 in an embodiment.

For this example of an 8-bit decoding segment, the in-flight PSUM storage 602 could also be erased when the PS8(0:7) partial sum is stored to the PSUM memory 606 at 610. The in-flight PSUM storage 602 could instead be over-written with new partial sum bits that are generated as subsequent bits in the received word are decoded.

As the bits #8 to #15 in the next 8-bit segment are decoded, partial sums are computed and stored to the in-flight PSUM storage 602. After bit #15 is decoded, and during decoding of bit #16 in the example shown, PS8(8:15) is transferred from the in-flight PSUM storage 602, to the PSUM scratchpad 604, as shown at 612. To compute the higher-order PS16(0:15), the lower-order PS8(8:15) is available in the PSUM scratchpad 604 as shown at 616, and PS8(0:7) is read from the PSUM memory 606 as shown at 614. PS16(0:15) is computed at 618 and is written to the PSUM memory 606 at 620. The PS16(0:15) computation involves only one memory read operation and only one memory write operation with the PSUM memory 606 in this example.

Partial sum computation proceeds in a similar manner for subsequent segments of bits. A partial sum is transferred from the in-flight PSUM storage 602 to either the PSUM scratchpad 604 or to the PSUM memory 606 after each decoding segment of 8 bits, as shown at 622, 624, 640. After every 16 bits, a higher-order partial sum computation is performed, at 636 for example, using a lower-order partial sum that is read from the PSUM memory 606 at 626, 628 and one or more lower-order partial sums available in the PSUM scratchpad 604, as shown at 630, 632, 634. The newly generated higher-order partial sum is written to the PSUM memory 606 at 638. Entries in the PSUM memory 606 which are no longer needed for decoding of subsequent bits or computation of other partial sums may be overwritten in the PSUM memory 606. As shown at 638, for example, PS16(0:15) and PS8(16:23) are overwritten by PS32(0:31).

During live PSUM computation, there is only one read operation or write operation involving the PSUM memory 606 per clock cycle. However, more than one read operation or write operation involving the PSUM memory 606 could be performed during PSUM computation over multiple clock cycles. For example, with higher-order PSUMs, the PSUM bits could be written over multiple cycles. Consider an example computation of a PS16 higher-order partial sum. PSUM16(8:15) could be written in one clock cycle, and PS16(0:7) could be written in a second clock cycle, to perform a PSUM update in reverse order relative to indices of the G nodes that use the PSUM bits.

As discussed in further detail herein, G nodes in a DDG may also be executed in a reverse order relative to node index. Provided there are at least as many PSUM bits available in a clock cycle as there are PEs, then live PSUM updating does not add decoding latency. In reverse order decoding, the G function is performed for a subset of G nodes in a DDG using available PSUM bits, during computation of PSUM bits that will be used in other G nodes.

The PSUM scratchpad 604 is used to temporarily store lower-order partial sums that are used in computing higher-order partial sums. For example, PS8(8:15) contributes more than once to PS16(0:15), because the polar code matrix PS8(8-15) is in both lower quadrants of PS16(0-15) as shown in FIG. 4. PS8(0:7) contributes only once, and is shown as being read from the PSUM memory 606 at 614 in FIG. 6. Similarly, PS8(16:23) contributes more than once to PS32(0:31), and is copied from the PSUM memory 606 into the PSUM scratchpad 604 at 626. PS8(24:31) and PS8(16:23) also contribute to PS32(0:31) and are also shown in the PSUM scratchpad 604. The PSUM scratchpad 604 could store PS16(16:31) instead of the two PS8 PSUMs. PS16(0:15) is shown as being copied into the PSUM scratchpad 604 in the example shown, but could instead be read from the PSUM memory 606 since PS16(0:15) only contributes once to PS32(0:31), because PS16(0-15) is only in the upper left quadrant of PS32(0-31) as shown in FIG. 4.

Although not explicitly shown in FIG. 6, additional PSUMs could also be computed and stored. For example, PS16(16:31), which is equivalent to partially computed PS32(16:31), could be stored to the PSUM scratchpad 604 for later use, and in the PSUM memory 606 with PS16(0:15). This PSUM computation and updating could be completed within two clock cycles, in an embodiment in which 8 PEs are used to update 16 PSUM bits. In the next 2 clock cycles, PS16(0:15) could be read from the PSUM memory 606 and combined with PS16(16:31) from the PSUM scratchpad 604, and PS16(0:15) is overwritten with the resultant PS32(0:31) in the PSUM memory 606, at 638. Reverse traversal of G nodes during decoding provides time for computation of the higher-order PS32(0:31) partial sum to be completed before decoding traversal reaches the G nodes that need the partial sum bits in the higher-order structure.

In conventional polar decoding, partial sums are updated after each bit is decoded, and before decoding of a next bit begins. As described herein, higher-order partial sum computations are performed during decoding of subsequent bits, and in this manner decoding latency could be reduced. In addition, partial sum memory ports may be running continuously for partial sum updates in conventional polar decoding, and partial sum updates may therefore consume significant power. Live higher-order partial sum computations as disclosed herein are performed only after segments of bits are decoded, thereby potentially reducing power consumption associated with partial sum updates. In FIG. 6, for example, higher-order partial sum computations are performed at 618, 636 after every 16 bits instead of performing a full partial sum update after every bit.

Faster or more power efficient memory could be used to store partial sums in conventional decoders, to reduce partial sum update latency or power consumption. For example, flip flops could be used to store partial sums. However, such storage for all partial sums tends to be practical for codeword lengths of at most a few hundred bits. Another hardware-based approach to improving partial sum update performance could involve storing partial sums in multiple shallow but wide memories. Such an approach, however, adds significant cost, and memory form factor could become a physical implementation issue.

The PSUM scratchpad 604 is provided to store lower-order partial sums that are used in computing higher-order partial sums, which may avoid at least some memory access operations with the PSUM memory 606 during higher-order partial sum computation. Consider an example of N=2048 bits codeword length, list size L=32 paths, 6-bit LLRs, and decoding of 4 codewords. The decoding of 4 codewords relates to an example implementation, and other embodiments could decode other numbers of codewords. Multi-codeword decoding may utilize existing hardware gates, when those gates would otherwise be idle, to process other codewords. For example, if only one codeword were to be decoded at a time, then the LLR nodes would be idle during each sort stage of decoding that codeword. In a multi-codeword decoding embodiment, another codeword could be processed at an LLR stage using those LLR nodes, instead of having those LLR nodes remain idle during the sort stage of a different codeword. Multi-codeword decoding could also realize a benefit from economy of scale of memory. As memory size increases to provide for multi-codeword decoding, the memory area per bit tends to decrease.

In the above example of 4-codeword decoding, LLR storage for 1024 Stage #0 LLR results is determined as follows:

1024LLR results*32 paths*LLR size*4 codewords=786,432 bits.

LLR storage for Stage #1 (512 LLR results) through Stage #10 (1 LLR result) can be similarly determined. Total LLR storage in this example is 1,572,096 bits, or approximately 1535.3 kb. For the PSUM memory 606, 1024 partial sum bits for 32 paths occupy 128 kb in this example. Total memory space for LLR memory and PSUM memory 606 in this example is approximately 1663.3 kb. In an embodiment, the PSUM scratchpad 604 is used to store only lower-order partial sums that contribute multiple times to a higher-order partial sum. The largest higher-order partial sum in this example is 1024 bits, and the largest lower-order partial sum that contributes multiple times to this largest higher-order partial sum is 512 bits. For 32 paths, total PSUM scratchpad 604 storage space is 16 kb, which represents an increase in total storage space of only about 0.96%.

The foregoing discussion of storage space is an illustrative example, and storage space may be different in other embodiments.

Figure 7:
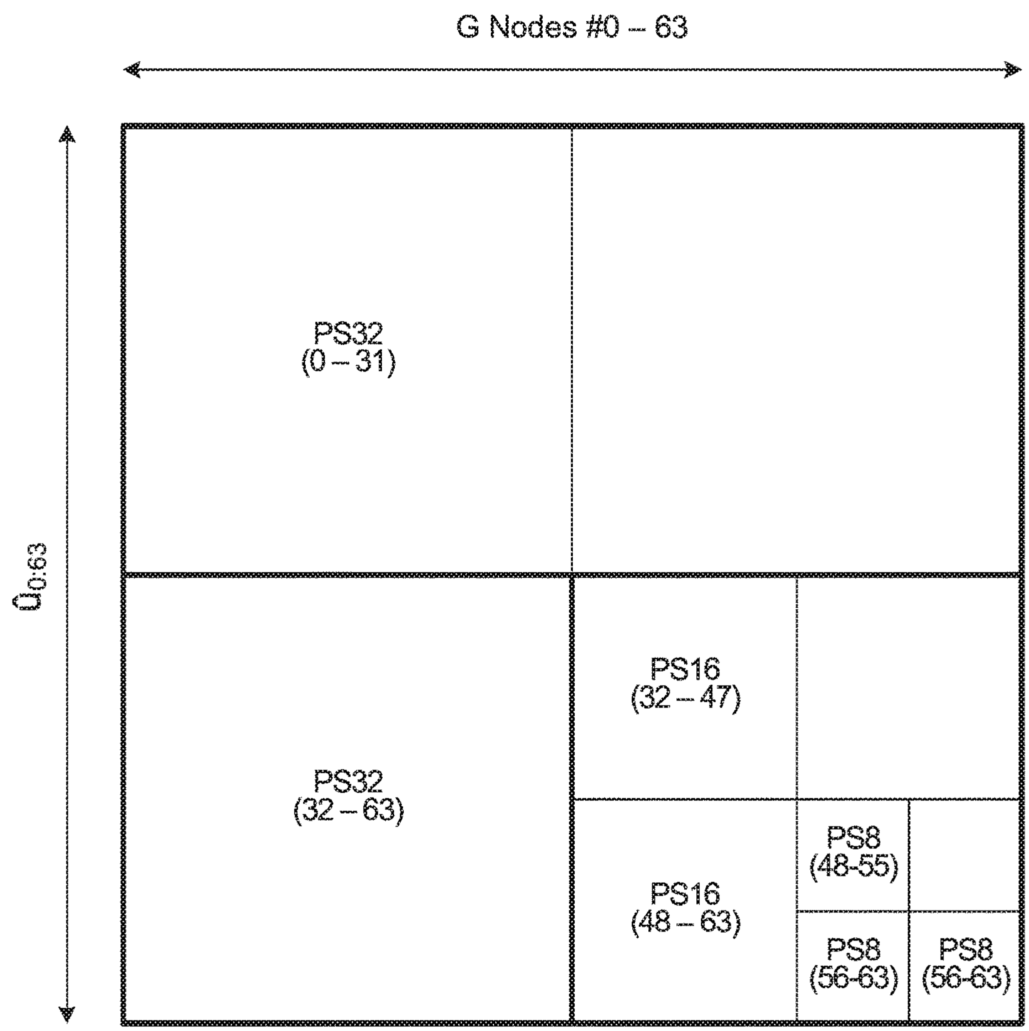
FIG. 7 is a block diagram illustrating an example polar code matrix which defines a partial sum computation.

FIG. 7 is a block diagram illustrating an example polar code matrix which defines a partial sum computation. The example polar code matrix is a 64-by-64 matrix defining a 64-bit partial sum which, in an embodiment with codeword length N=2048 and decoder DDG Stages #0 to #10, is constructed at DDG Stage #4 for decoding bit 64 using:

PS32(0:31) from PSUM memory, constructed at decoded bit 32 in accordance with polar code matrix PS32(0-31)

PS16(32:47) from PSUM memory, constructed at decoded bit 48 in accordance with polar code matrix PS16(32-47)

PS8(48:55) from PSUM memory, constructed at decoded bit 56 in accordance with polar code matrix PS8(48-55)

PS8(56:63) from in-flight PSUM storage.

As noted above, each G node combines a respective partial sum bit with LLR values in executing the G function. The 64-by-64 polar code matrix shown in FIG. 7 and the corresponding 64-bit partial sum apply to a DDG with 64 G nodes per stage. The example DDG in FIG. 2 includes 8 G nodes per stage, and the example 8-by-8 polar code matrix in FIG. 3 illustrates how the PSUM bits for each G node 0-7 at Stage #0 is computed. FIG. 7 similarly represents a 64-by-64 polar code matrix, without showing all 4096 row and column entries. In this example, G nodes 56-63 use PSUM bits that are computed in accordance with PS8(56-63), G nodes 48-55 use PSUM bits computed in accordance with PS8(48-55) and PS8(56-63), and so on.

Reverse order partial sum computation and reverse order traversal of the PS64(0-63) structure in FIG. 7 proceeds as described below in an embodiment. The following description of G node processing relates to an example implementation of parallel decoding of L paths using 8 PEs per path. Different numbers of PEs could be used in other embodiments.

G Nodes #56-63 (Clock Cycle 1):

use PS8(56:63), available from the in-flight PSUM storage after the preceding bit #63 is decoded, and execute G functions store PS8(56:63) to the PSUM memory for PS64(56:63), and to the PSUM scratchpad for PS16(56:63)

G Nodes #48-55 (Clock Cycle 2):

read PS8(48:55), which was previously stored to the PSUM memory after decoding of bit #55, from the PSUM memory PS8(56:63) is available in the PSUM scratchpad compute PS8(48:55)+PS8(56:63) and execute G functions store PSUM results to the PSUM memory for PS64(48:55) and to the PSUM scratchpad for PS16(48:55)—at this point, PS16(48:63) is available in the PSUM scratchpad; PS16(48:63) is the equivalent of the next structure PS32(48:63)

G Nodes #40-47 (Clock Cycle 3):

read PS16(40:47) from memory and PS16(56:63) from the PSUM scratchpad compute PS16(40:47)+PS16(56:63) and execute G functions store PSUM results in the PSUM memory for PS64(40:47) and the PSUM scratchpad for PS32(40:47)

G Nodes #32-39 (Clock Cycle 4):

read PS16(32:39) from the PSUM memory and PS16(48:55) from the PSUM scratchpad compute PS16(32:39)+PS16(48:55) and execute G functions store PSUM results in the PSUM memory for PS64(32:39) and the PSUM scratchpad for PS32(32:39)—at this point, PS32(32:63) is available in the PSUM scratchpad G Nodes #0-31 (Over Clock Cycles 5 to 8, 8 Nodes in 8 PEs Per Cycle):

read PS32(0:31) from the PSUM memory and PS32(32:63) from the PSUM scratchpad compute PS32(0:31)+PS32(32:63) and execute G functions store PSUM results in the PSUM memory for PS64(0:31)—at this point, PS64(0:63) is available in the PSUM memory.

When PS64(0:63) is written to the PSUM memory, it overwrites the existing PS32(0:31), PS16(32:47) and PS8(48:55), which are no longer needed.

The example in FIG. 7 and described above relates to computation of a PS64 partial sum from lower-order partial sums in an embodiment in which in-flight partial sum updates are based on 8-bit decoding segments. Partial sums PS8(*y:z*) based on the previous 8 decoded bits are computed using the 8-by-8 polar code matrix shown in FIG. 3, and are used in computing higher-order partial sums. After every PM sort, the decoder updates the in-flight PSUM storage using a decoding path to list position mapping. The decoder adds, to the parent decoding path partial sum bits, the estimated values for newly decoded bits and updates the in-flight partial sum for each list position.

Consider again an example of N=2048, 11-stage decoding with 8-bit decoding segmentation. When the decoder starts the LLR computations at Stage #7 for decoded bit x (x=8, 24, 40, . . . ), it copies the in-flight PS8 from the current list position to the PSUM memory, as shown at 610, 622, 640 in FIG. 6. When the decoder starts the LLR computations at Stage #6 for decoded bit x (x=16, 48, 80, . . . ), it computes the PS16 based on the previous 16 decoded bits and writes it to the PSUM memory for the current list position, as shown at 620 in FIG. 6. The PS16(0:15) computation, for example, uses the in-flight partial sum PS8(0:7) and PSUM memory PS8(8:15) from its parent decoding path. When the decoder starts the LLR computations at Stage #5 for decoded bit x (x=32, 96, 160, . . . ), it computes the PS32 based on the previous 32 decoded bits and writes it to the PSUM memory for the list position, as shown at 638 in FIG. 6. The PS32(0:31) computation, for example, uses the in-flight PSUM PS8(24:31) and PSUM memory PS8(16:23) and PS16(0:15) from its parent decoding path. PS64 computation is described above. At Stage #4 for decoded bits x (x=64, 192, 320, . . . ), the decoder computes the PS64 based on the previous 64 decoded bits and writes it to the PSUM memory for the current list position. The PS64(0:63) computation, for example, uses the in-flight PSUM PS8(56:63) and PSUM memory PS8(48:55), PS16(32:47) and PS32(0:31) from its parent decoding path.

Higher-order partial sums are similarly computed. When the decoder starts the LLR computations at Stage #3 for N=2048 and decoded bit x (x=128, 384, 640, . . . ), the decoder computes the PS128 based on the previous 128 decoded bits and writes it to the PSUM memory for the current list position. The PS128(0:127) computation, for example, uses the in-flight PSUM PS8(120:127) and PSUM memory PS8(112:119), PS16(96:118), PS32(64:95) and PS64(0:63) from its parent decoding path. When the decoder starts the LLR computations at Stage #2 for decoded bit x (x=256, 768, 1280, 1792), it computes the PS256 based on the previous 256 decoded bits and writes it to the PSUM memory for the current list position. The PS256(0:255) computation, for example, uses the in-flight PSUM PS8(248:255), PSUM memory PS8(240:247), PS16(224:239), PS32(192:223) and PS64(128:191), and PSUM memory PS128(0:127) from its parent decoding path. When the decoder starts the LLR computations at Stage #1 for decoded bit x (x=512, 1536), it computes the PS512 based on the previous 512 decoded bits and writes it to the PSUM memory for the current list position. The PS512(0:511) computation uses the in-flight PSUM PS8(504:511), PSUM memory PS8(296:503), PS16(280:295), PS32(448:479) and PS64(384:447), and PSUM memory PS128(256:446) and PS256(0:255) from its parent decoding path. When the decoder starts the LLR computations at Stage #0 for decoded bit x (x=1024), it constructs the PS1024 based on the previous 1024 decoded bits and writes it to the PSUM memory for the current list position. The PS1024(0:1023) computation uses the in-flight PSUM PS8(1016:1023), PSUM memory PS8(1008:1015), PS16(992:1007), PS32(960:991) and PS64(896:959), and PSUM memory PS128(768:895), PS256(512:767) and PS512(0:511) from its parent decoding path.

This example illustrates how higher-order partial sums are computed, by building up the higher-order partial sums from lower-order partial sums that are based on previously decoded bits. The lower-order partial sums are used in computing the higher-order partial sums in a reverse order relative to the order in which at least some of the previously decoded bits were decoded, and G nodes are traversed during decoding of subsequent bits in a reverse order relative to an order or index of the nodes in a DDG. In FIG. 7, computation of the example PS64 partial sum starts with PS8(56:63) based on the most recently decoded 8 bits, then PS8(48:55) based on the previously decoded 8 bits, and so on, using partial sums based on segments of bits in a reverse order relative to the order in which those segments of bits were decoded. As described above, G node traversal in the DDG is also in a reverse order, starting with G nodes 56-63, 48-55, and so on.

Figure 8:
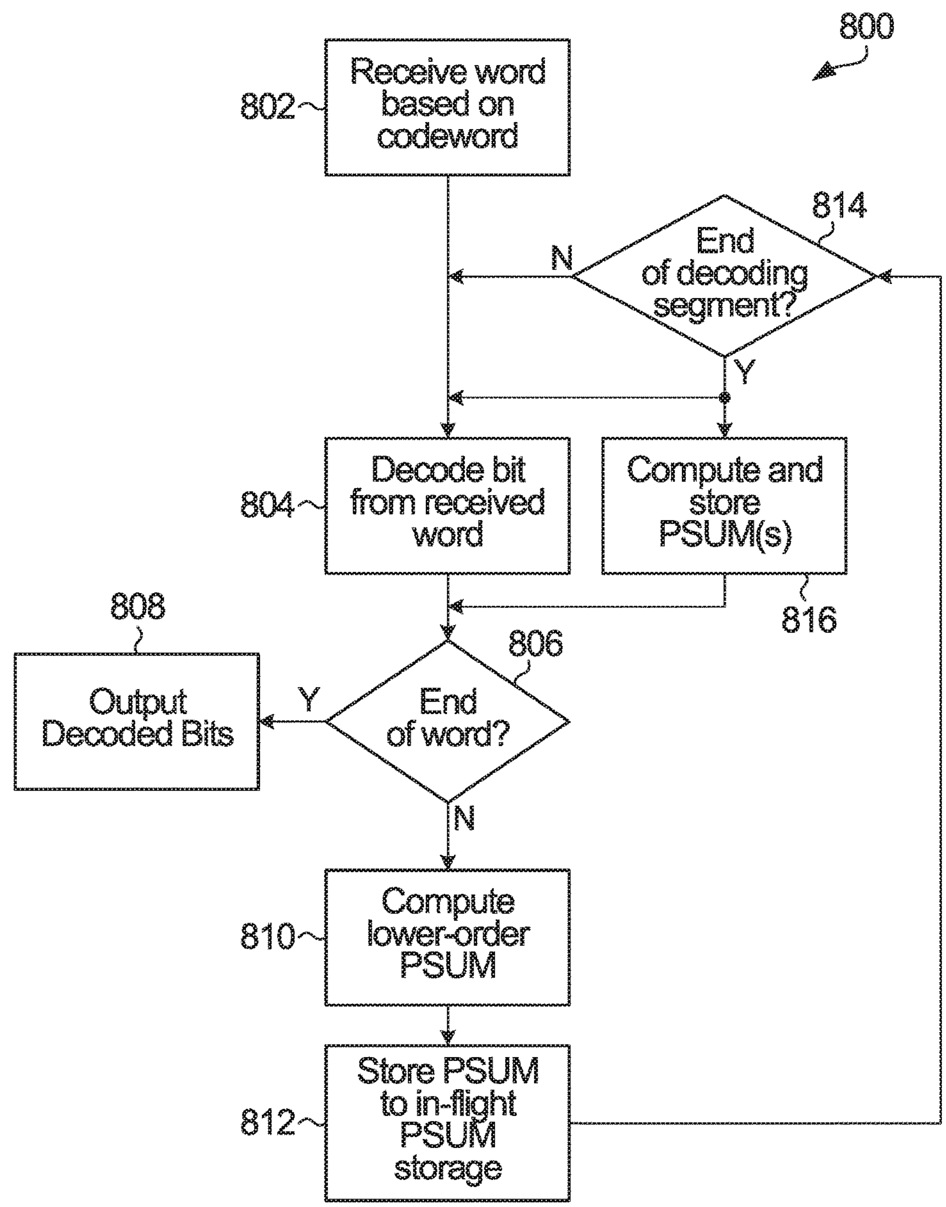
FIG. 8 is a flow diagram illustrating an example polar code decoding method according to an embodiment.

FIG. 8 is a flow diagram illustrating an example polar code decoding method according to an embodiment. The example method 800 involves receiving a word that is based on a codeword of a polar code. The codeword is transmitted by a transmitter, and the received word might not be identical to the originally transmitted codeword, due to noise and/or other communication channel effects.

A bit in the received word is decoded at 804 to generate a decoded bit. Decoded bits are output at 808, for additional receiver processing, if it is determined at 806 that decoding has reached the end of the received word. Otherwise, a lower-order partial sum is updated at 810 based on the decoded bit, and is stored to in-flight storage at 812. At 814, a determination is made as to whether decoding has reached the end of a decoding segment. For example, with reference to FIG. 6, a decoding segment is 8 bits in length, and at the end of each 8-bit segment a PS8 partial sum is stored to the PSUM scratchpad 604 at 612, 624 (after decoding an even number of 8-bit segments) or to the PSUM memory 606 at 610, 622, 640 (after decoding an odd number of 8-bit segments). If the end of a decoding segment has not been reached, then decoding proceeds to the next bit of the received word, at 804.

Figure 9:
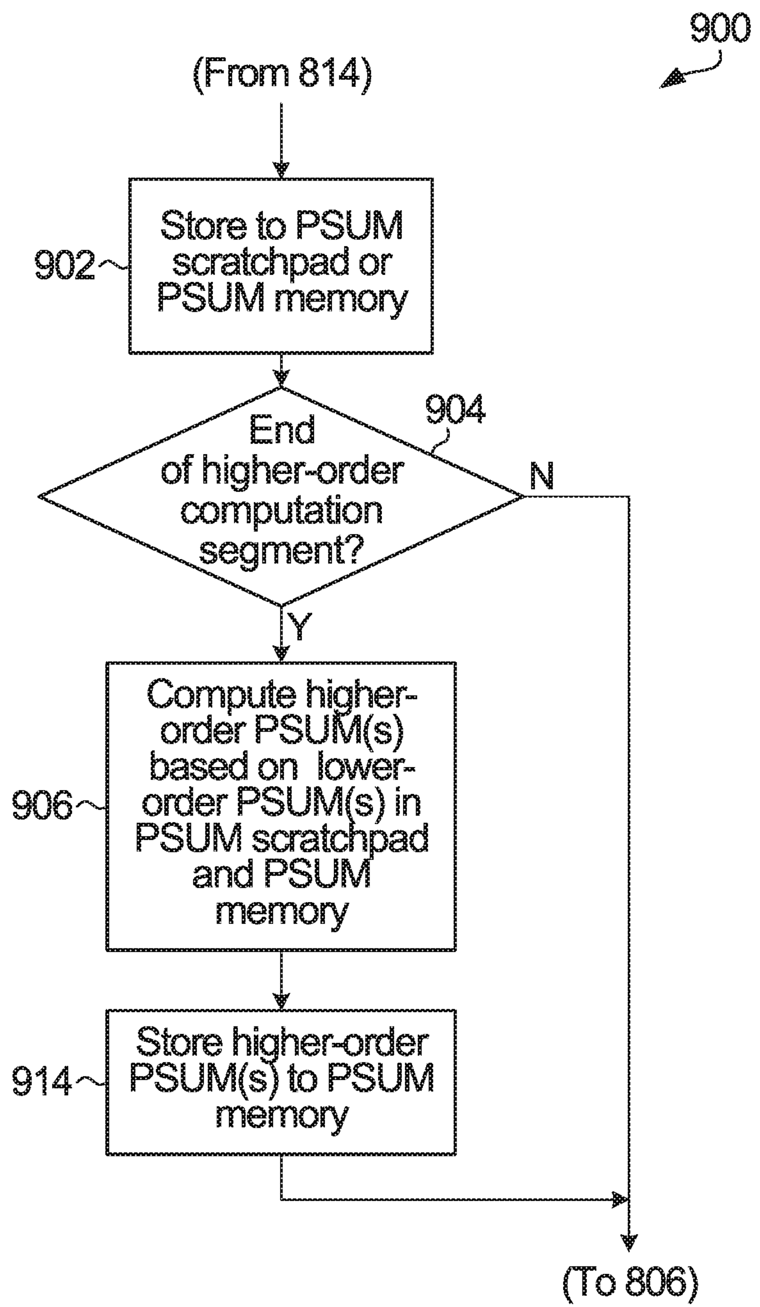
FIG. 9 is a flow diagram illustrating an example partial sum computation method according to an embodiment.

At the end of a decoding segment, a higher-order partial sum is computed and stored at 816, during decoding of a subsequent bit in the received word at 804. FIG. 9 is a flow diagram illustrating an example partial sum computation method according to an embodiment. The method 900 is illustrative of an embodiment of partial sum computation and storage at 816 in FIG. 8.

At 902, a partial sum is stored to temporary storage in the form of the PSUM scratchpad, and/or to the PSUM memory, as noted above with reference to FIG. 6. Higher-order partial sums are also computed at the end of every second decoding segment, based on lower-order partial sums. This is shown in FIG. 9 at 904 as a determination of whether the end of a higher-order computation segment has been reached, and at 906 as a computation of a higher-order partial sum based on lower-order partial sums in the PSUM scratchpad and the PSUM memory. The lower-order partial sums are retrieved from the PSUM memory and the PSUM scratchpad. The computed higher-order partial sum is stored to at least the PSUM memory at 914. With reference to FIG. 6, higher-order partial sum computations are shown at 618, 636, and storage to the PSUM memory 606 is shown at 620, 638. More than one higher-order partial sum may be computed at 906 and stored at 914.

Higher-order partial sum computations at 906 in FIG. 9 involve combining multiple lower-order partial sums that were previously computed based on previously decoded bits. The previously computed partial sums are combined according to a reverse order relative to an order in which at least some of the previously decoded bits were decoded. As discussed above with reference to FIG. 7, for example, computation of PS64(0:63) begins with PS8(56:63) and proceeds with building up the PS64 partial sum from partial sums that were computed based on earlier decoded bits.

Returning to FIG. 8, bits in a subsequent decoding segment in the received word are decoded at 804 using the higher-order partial sum that is computed and stored at 816. The lower-order partial sum from a previous decoding segment is used in computing the higher-order partial sum, and other lower-order partial sums may also be used in computing the higher-order partial sum. The decoding at 804 may involve decoding bits in a subsequent decoding segment by traversing nodes in a DDG of the polar code in a reverse order relative to node indices of at least some of the nodes in the DDG. In the example described above with reference to FIG. 7, G nodes #56-63 are traversed before G nodes #48-55, which are traversed before G nodes #40-47, and so on.

Figure 10:
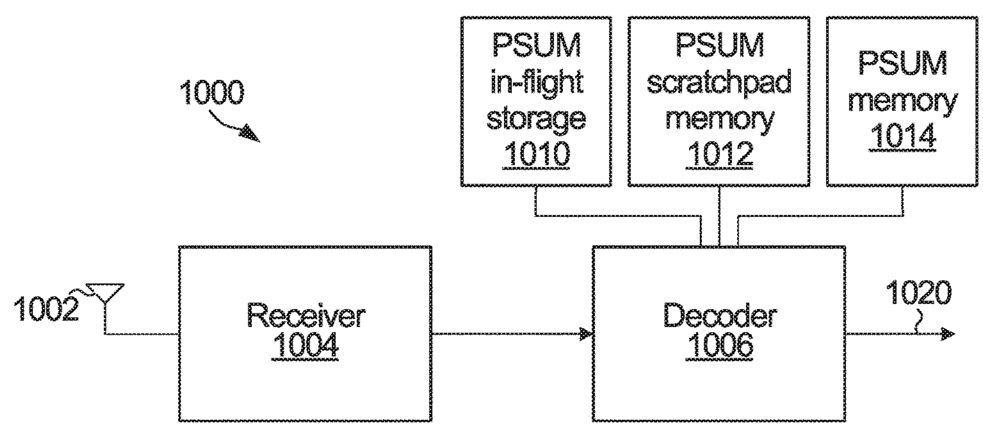
FIG. 10 is a block diagram of an apparatus for receiving and decoding codewords.

FIG. 10 is a block diagram of an apparatus for receiving and decoding codewords. The apparatus 1000 includes a receiver 1004 coupled to an antenna 1002 for receiving signals from a wireless channel, and a decoder 1006. PSUM in-flight storage 1010, a PSUM scratchpad memory 1012, and a PSUM memory 1014 are coupled to the decoder 1006. In some embodiments, the receiver 1004 includes a demodulator, an amplifier, and/or other components of an RF receive chain. The receiver 1004 receives, via the antenna 1002, a word that is based on a codeword of a polar code. Decoded bits are output at 1020 for further receive processing. The decoder 1006 is implemented in circuitry, such as a processor, that is configured to decode bits in the received word using partial sums as disclosed herein. The PSUM in-flight storage 1010 is implemented using registers or flip-flops in an embodiment, and the PSUM scratchpad memory 1012 and the PSUM memory 1014 could include one or more solid-state memory devices and/or memory devices with movable and possibly removable storage media. In a processor-based implementation of the decoder 1006, processor-executable instructions to configure a processor to perform operations such decoding and partial sum computation are stored in a non-transitory processor-readable medium. The non-transitory medium could include the same memory device(s) used for the PSUM scratchpad memory 1012 and/or the PSUM memory 1014, or one or more separate memory devices.

The decoder 1006 is configured to decode bits in a decoding segment of the received word to generate decoded bits, to update a lower-order partial sum based on the decoded bits, and to compute a higher-order partial sum based on the lower-order partial sum during decoding of a subsequent bit in the received word. The PSUM in-flight storage 1010 is illustrative of partial sum storage for storing lower-order partial sums as bits in each decoding segment are decoded, and the decoder 1006 is configured to update the lower-order partial sums by updating the lower-order partial sums in the PSUM in-flight storage. The decoder 1006 is also configured to store computed higher-order partial sums to the PSUM memory 1014. The PSUM scratchpad memory 1012 is illustrative of temporary partial sum storage, which the decoder 1006 is configured to use during computation of higher-order partial sums. For example, the decoder 1006 could be configured to retrieve lower-order partial sums from the PSUM scratchpad memory 1012 and the PSUM memory 1014 for computation of a higher-order partial sum, and/or to store computation results to one or both of the PSUM scratchpad memory and the PSUM memory. The decoder 1006 is also or instead configured to implement reverse order PSUM computation and/or reverse order DDG node traversal in some embodiments.

Figure 11:
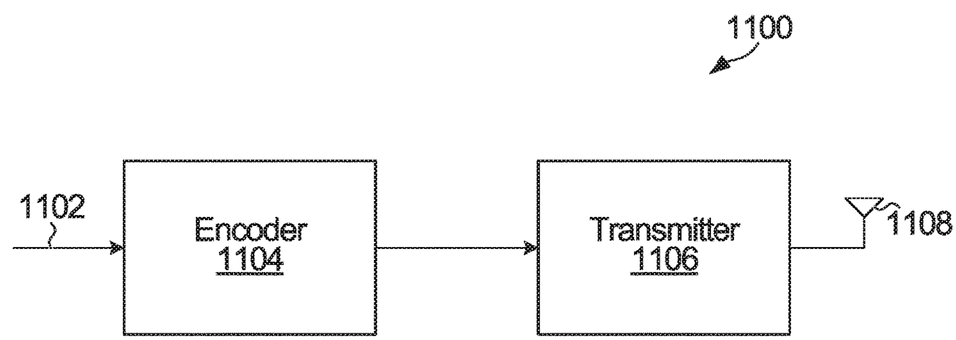
FIG. 11 is a block diagram of an example apparatus for encoding and transmitting codewords.

FIG. 11 is a block diagram of an example apparatus for encoding and transmitting codewords. The apparatus 1100 includes an encoder 1104 coupled to a transmitter 1106. The encoder 1102 is implemented in circuitry that is configured to encode an input bit stream 1102 using a polar code. In the illustrated embodiment, the apparatus 1100 also includes an antenna 1108, coupled to the transmitter 1106, for transmitting signals over a wireless channel. In some embodiments, the transmitter 1106 includes a modulator, an amplifier, and/or other components of an RF transmit chain.

In some embodiments, the apparatus 1100, and similarly the apparatus 1000 in FIG. 10, include a non-transitory computer readable medium that includes instructions for execution by a processor to implement or control operation of the encoder 1104 in FIG. 11, to implement or control operation of the decoder 1006 in FIG. 10, and/or to otherwise control the execution of methods described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk.

Communication equipment could include the apparatus 1000, the apparatus 1100, or both a transmitter and a receiver and both an encoder and a decoder. Such communication equipment could be user equipment or communication network equipment.

The previous description of some embodiments is provided to enable any person skilled in the art to make or use an apparatus, method, or processor readable medium according to the present disclosure. Various modifications to these embodiments will be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

I claim:

1. A method comprising:

receiving a word that is based on a codeword of a polar code;

decoding bits in a decoding segment of the received word to generate decoded bits;

updating and storing a lower-order partial sum based on the decoded bits;

starting decoding of a subsequent bit in the received word;

computing a higher-order partial sum based on the lower-order partial sum during the decoding of the subsequent bit in the received word; and storing the computed higher-order partial sum.

2. The method of claim 1, wherein the updating and storing comprises updating the lower-order partial sum in partial sum storage.

3. The method of claim 1, wherein storing the computed higher-order partial sum comprises storing the computed higher-order partial sum to partial sum memory.

4. The method of claim 3, wherein the computing comprises computing the higher-order partial sum based on multiple lower-order partial sums including the lower-order partial sum and at least one further lower-order partial sum, and wherein the method further comprises:

retrieving one of the multiple lower-order partial sums from the partial sum memory; and retrieving another one of the multiple lower-order partial sums from partial sum scratchpad storage.

5. The method of claim 1, further comprising:

decoding bits in a subsequent decoding segment in the received word using the higher-order partial sum.

6. The method of claim 5, wherein decoding bits in the subsequent decoding segment comprises traversing nodes in a Data Dependency Graph (DDG) of the polar code in a reverse order relative to node indices of at least some of the nodes in the DDG.

7. The method of claim 5, wherein the computing comprises combining multiple lower-order partial sums, including the lower-order partial sum and at least one further lower-order partial sum, which lower-order partial sums are based on previously decoded bits including the generated decoded bits, and wherein the combining comprises combining the multiple lower-order partial sums according to a reverse order relative to an order in which at least some of the previously decoded bits were decoded.

8. An apparatus comprising:

a receiver to receive a word that is based on a codeword of a polar code; and a decoder, coupled to the receiver, to decode bits in a decoding segment of the received word to generate decoded bits, to update and store a lower-order partial sum based on the decoded bits, to start decoding of a subsequent bit in the received word, to compute a higher-order partial sum based on the lower-order partial sum during the decoding of the subsequent bit in the received word, and to store the computed higher-order partial sum.

9. The apparatus of claim 8, further comprising:

partial sum storage, coupled to the decoder, storing the lower-order partial sum, wherein the decoder is configured to update and store the lower-order partial sum by updating the lower-order partial sum in the partial sum storage.

10. The apparatus of claim 8, further comprising:

partial sum memory coupled to the decoder, wherein the decoder is configured to store the computed higher-order partial sum to the partial sum memory.

11. The apparatus of claim 10, further comprising:

partial sum scratchpad storage coupled to the decoder, wherein the decoder is configured to compute the higher-order partial sum based on multiple lower-order partial sums including the lower-order partial sum and at least one further lower-order partial sum, and wherein the decoder is further configured to retrieve one of the multiple lower-order partial sums from the partial sum memory, and to retrieve another one of the multiple lower-order partial sums from the partial sum scratchpad storage.

12. The apparatus of claim 8, wherein the decoder is further configured to decode bits in a subsequent decoding segment in the received word using the higher-order partial sum, wherein the decoder is configured to decode the bits in the subsequent decoding segment by traversing nodes in a Data Dependency Graph (DDG) of the polar code in a reverse order relative to node indices of at least some of the nodes in the DDG.

13. The apparatus of claim 8, wherein the decoder is further configured to decode bits in a subsequent decoding segment in the received word using the higher-order partial sum, wherein the decoder is configured to compute the higher-order partial sum by combining multiple lower-order partial sums, including the lower-order partial sum and at least one further lower-order partial sum, which lower-order partial sums are based on previously decoded bits including the generated decoded bits, and wherein the decoder is configured to combine the multiple lower-order partial sums according to a reverse order relative to an order in which at least some of the previously decoded bits were decoded.

14. A non-transitory processor-readable medium storing instructions which, when executed by one or more processors, cause the one or more processors to perform a method comprising:

receiving a word that is based on a codeword of a polar code;

decoding bits in a decoding segment of the received word to generate decoded bits;

updating and storing a lower-order partial sum based on the decoded bits;

starting decoding of a subsequent bit in the received word;

computing a higher-order partial sum based on the lower-order partial sum during the decoding of the subsequent bit in the received word; and storing the computed higher-order partial sum.

15. A method comprising:

receiving a word that is based on a codeword of a polar code;

decoding bits in the received word to generate decoded bits;

computing and storing a partial sum based on the decoded bits; and decoding subsequent bits in the received word using the partial sum in traversing nodes in a Data Dependency Graph (DDG) of the polar code in a reverse order relative to node indices of at least some of the nodes in the DDG.

16. The method of claim 15, further comprising:

combining the partial sum, and at least one further partial sum that is based on previously decoded bits, into a higher-order partial sum according to a reverse order relative to an order in which the decoded bits and the previously decoded bits were decoded.

17. The method of claim 16, wherein the combining is performed during the decoding of the subsequent bits, and wherein the subsequent bits in the received word are decoded using the higher-order partial sum.

18. An apparatus comprising:

a receiver to receive a word that is based on a codeword of a polar code;

a decoder, coupled to the receiver, to decode bits in the received word to generate decoded bits, to compute and store a partial sum based on the decoded bits, and to decode subsequent bits in the received word using the lower-order partial sum in traversing nodes in a Data Dependency Graph (DDG) of the polar code in a reverse order relative to node indices of at least some of the nodes in the DDG.

19. The apparatus of claim 18, wherein the decoder is further configured to combine the lower-order partial sum and at least one further lower-order partial sum that is based on previously decoded bits into a higher-order partial sum according to a reverse order relative to an order in which the decoded bits and the previously decoded bits were decoded.

20. The apparatus of claim 19, wherein the decoder is configured to combine the lower-order partial sum and the further lower-order partial sum during the decoding of the subsequent bits, and to decode the subsequent bits in the received word using the higher-order partial sum.

21. A non-transitory processor-readable medium storing instructions which, when executed by one or more processors, cause the one or more processors to perform a method comprising:

receiving a word that is based on a codeword of a polar code;

decoding bits in the received word to generate decoded bits;

computing and storing a partial sum based on the decoded bits; and decoding subsequent bits in the received word using the partial sum in traversing nodes in a Data Dependency Graph (DDG) of the polar code in a reverse order relative to node indices of at least some of the nodes in the DDG.

* * * * *